(12) United States Patent
Liu et al.

(10) Patent No.: US 10,311,277 B2
(45) Date of Patent: Jun. 4, 2019

(54) DISPLAY PANEL AND METHOD OF MANUFACTURING THE SAME, AND DISPLAY APPARATUS

(71) Applicant: BOE TECHNOLOGY GROUP CO., LTD., Beijing (CN)

(72) Inventors: Yingming Liu, Beijing (CN); Xue Dong, Beijing (CN); Jing Lv, Beijing (CN); Haisheng Wang, Beijing (CN); Xiaochuan Chen, Beijing (CN); Chun Wei Wu, Beijing (CN); Xiaoliang Ding, Beijing (CN); Shengji Yang, Beijing (CN); Rui Xu, Beijing (CN); Changfeng Li, Beijing (CN); Lijun Zhao, Beijing (CN); Yuzhen Guo, Beijing (CN); Yanan Jia, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/552,164

(22) PCT Filed: Feb. 13, 2017

(86) PCT No.: PCT/CN2017/073351
§ 371 (c)(1),
(2) Date: Aug. 18, 2017

(87) PCT Pub. No.: WO2018/000824
PCT Pub. Date: Jan. 4, 2018

(65) Prior Publication Data
US 2018/0247099 A1    Aug. 30, 2018

(30) Foreign Application Priority Data
Jun. 30, 2016 (CN) .......................... 2016 1 0509906

(51) Int. Cl.
*G06K 9/00* (2006.01)
*G06F 3/042* (2006.01)
(Continued)

(52) U.S. Cl.
CPC .......... *G06K 9/0004* (2013.01); *G06F 3/042* (2013.01); *G06F 3/044* (2013.01); *G06K 9/00* (2013.01);
(Continued)

(58) Field of Classification Search
CPC .......................... H01L 27/323; H01L 27/3234
See application file for complete search history.

(56) References Cited

U.S. PATENT DOCUMENTS

| 7,920,130 B2 | 4/2011 | Tien |
| 9,558,390 B2 | 1/2017 | Withers et al. |

(Continued)

FOREIGN PATENT DOCUMENTS

| CN | 101364155 A | 2/2009 |
| CN | 104318205 A | 1/2015 |

(Continued)

OTHER PUBLICATIONS

The International Search Report and the Written Opinion, including English translation of the International Search Report and the Written Opinion from PCT/073351, dated Feb. 13, 2017, 22 pages.

(Continued)

*Primary Examiner* — Ryan A Lubit
(74) *Attorney, Agent, or Firm* — Westman, Champlin & Koehler, P.A.

(57) ABSTRACT

The present disclosure relates to a display panel and a method of manufacturing the same, as well as a display apparatus. The display panel comprises an array substrate, a packaging substrate jointed to the array substrate, a photosensitive device, and a touch sensitive device; the photo- (Continued)

sensitive device and the touch sensitive device are formed between the packaging substrate and the array substrate, and the touch sensitive device is positioned between the photo-sensitive device and the packaging substrate.

19 Claims, 12 Drawing Sheets

(51) Int. Cl.
    *H01L 27/32*     (2006.01)
    *G06F 3/044*     (2006.01)
    *H01L 27/146*     (2006.01)

(52) U.S. Cl.
    CPC ............ *G06K 9/0008* (2013.01); *H01L 27/32* (2013.01); *H01L 27/323* (2013.01); *H01L 27/3234* (2013.01); *H01L 27/14678* (2013.01)

(56) References Cited

U.S. PATENT DOCUMENTS

| | | | |
|---|---|---|---|
| 9,589,170 B2 | 3/2017 | Ling | |
| 2009/0021487 A1* | 1/2009 | Tien | G06F 3/041 345/173 |
| 2014/0218327 A1* | 8/2014 | Shi | G06F 3/041 345/174 |
| 2015/0205440 A1 | 7/2015 | Yang et al. | |
| 2015/0331508 A1* | 11/2015 | Nho | G06F 3/0421 345/173 |
| 2016/0026842 A1 | 1/2016 | Withers et al. | |
| 2016/0092717 A1 | 3/2016 | Ling | |
| 2016/0349882 A1 | 12/2016 | Liu et al. | |
| 2017/0091513 A1 | 3/2017 | Withers et al. | |
| 2017/0115811 A1 | 4/2017 | Yang et al. | |
| 2017/0372114 A1* | 12/2017 | Cho | G01J 1/0219 |
| 2018/0196985 A1* | 7/2018 | Ling | G06K 9/0004 |

FOREIGN PATENT DOCUMENTS

| | | |
|---|---|---|
| CN | 104850292 A | 8/2015 |
| CN | 104881195 A | 9/2015 |
| CN | 105184282 A | 12/2015 |
| CN | 106095211 A | 11/2016 |
| EP | 2 101 251 A2 | 9/2009 |

OTHER PUBLICATIONS

Extended European search report for European Patent Application No. 17749596.7, dated Aug. 17, 2018, 7 pages.

* cited by examiner

DISPLAY PANEL AND METHOD OF MANUFACTURING THE SAME, AND DISPLAY APPARATUS

CROSS-REFERENCE TO RELATED APPLICATION

The present application is a Section 371 National Stage Application of International Application No. PCT/CN2017/073351, filed Feb. 13, 2017, which has not yet published, and claims priority from Chinese Patent Application No. 201610509906.5, filed on Jun. 30, 2016 before the Chinese Patent Office, the contents of which are incorporated herein by reference in their entirety.

TECHNICAL FIELD

Embodiments of the present disclosure generally relate to the field of display technology, and in particular, relate to a display panel and a method of manufacturing the same, as well as a display apparatus.

DESCRIPTION OF THE RELATED ART

Organic Light-Emitting Diode (OLED) display apparatus now plays a more and more important role in individual life for its advantages, such as self-luminescence, high contrast, less thickness, wide angle of view, high reaction speed and the like. Users often store a lot of important personal information and work materials in the display apparatus. Thus, the storage safety of the display apparatus becomes particularly critical. Now, the common methods for enhancing the storage safety of the display apparatus include setting a secret code in form of a password, a pattern or a combination of a password and a pattern, or the like. However, some problems exist in the practical applications, for example, the secret code is easy to be disclosed or cracked if the secret code is too simple; the secret code is difficult to be remembered by users if the secret code is too complex.

In the prior art, a fingerprint identification device is provided outside of a display panel of the display apparatus, such that the fingerprint pattern of the user's finger can be identified to achieve the function of identifying the fingerprint. With the fingerprint identification device, the safety of the display apparatus can be enhanced by the fingerprint identifying technology. A touch sensitive device is provided on an array substrate of the display panel to achieve the touch control function, and the position of a user's finger on the display panel can be determined by the touch sensitive device.

The above mentioned display panel cannot achieve the fingerprint identifying function and the touch control function at the same time, since the fingerprint identifying device is provided outside of the display panel. Accordingly, the display panel can only provide a relatively single function.

SUMMARY

The present disclosure is provided to overcome at least one of the above and other problems defects in the prior arts.

Embodiments of the present disclosure provide a display panel and a method of manufacturing the same, as well as a display apparatus.

According to a first aspect of the present disclosure, there is provided a display panel, comprising: an array substrate, a packaging substrate jointed to the array substrate, a photosensitive device, and a touch sensitive device; the photosensitive device and the touch sensitive device are formed between the packaging substrate and the array substrate, and the touch sensitive device is positioned between the photosensitive device and the packaging substrate.

In an embodiment, the touch sensitive device is configured to determine information about a position where a user's finger touches the display panel, and the photosensitive device is configured to receive a light signal reflected by a fingerprint pattern of the user's finger, and to generate a current signal for identifying the fingerprint pattern on the basis of the light signal.

In an embodiment, a display area of the array substrate includes a light transmission region and a light non-transmission region, the photosensitive device includes a plurality of photosensitive modules arranged in an array, scanning lines each corresponding to and electrically connected to one row of the photosensitive modules, and read lines each corresponding to and electrically connected to one column of the photosensitive modules, the plurality of photosensitive modules being divided into n photosensitive module groups, where n is equal to or greater than one, an orthographic projection of each photosensitive module on the array substrate is located within the light non-transmission region of the array substrate, the touch sensitive device includes n touch sensitive electrodes, each of which is superposed on and electrically connected to one of the photosensitive module groups, and each of the photosensitive modules is configured to output the current signal through a corresponding one of the read lines under a scanning signal output by a corresponding one of the scanning lines.

In an embodiment, each of the photosensitive modules includes a photosensitive sub-module electrically connected to a corresponding one of touch sensitive electrodes, and a switch sub-module electrically connected to the scanning line, the read line and the photosensitive sub-module respectively.

In an embodiment, the photosensitive sub-module includes a first electrode and a photosensitive material layer formed between the touch sensitive electrode and the first electrode, the photosensitive material layer being in contact with the touch sensitive electrode and the first electrode; and the switch sub-module is a thin film transistor, a gate of the thin film transistor being connected to the scanning line, one of a source electrode and a drain electrode of the thin film transistor being electrically connected to the read line, the other one of the source electrode and the drain electrode of the thin film transistor being electrically connected to the first electrode of the photosensitive sub-module.

In an embodiment, the photosensitive device is further configured to determine information about a position where the user's finger touches the display panel.

In an embodiment, the display panel further includes a flexible circuit board respectively electrically connected to the scanning lines and the read lines.

In an embodiment, the display panel further includes an integrated circuit respectively electrically connected to the scanning lines and the read lines.

In an embodiment, the touch sensitive electrode is made of a transparent conductive material.

In an embodiment, the first electrode is a reflecting electrode configured to reflect light reflected by the fingerprint pattern, and the display panel further includes a circular polarizer provided on a side of the packaging substrate facing away from the photosensitive device and the touch sensitive device.

According to a second aspect of the present disclosure, there is provided a method of manufacturing a display panel comprising an array substrate and a packaging substrate, the method comprising:

forming a photosensitive device and a touch sensitive device on a preset packaging jointing surface, which is a surface of the packaging substrate or an light-exiting surface of the array substrate, such that the touch sensitive device is positioned between the photosensitive device and the packaging substrate; and jointing the packaging substrate with the array substrate so that the photosensitive device and the touch sensitive device are both positioned between the packaging substrate and the array substrate.

In an embodiment, a display area of the array substrate includes a light transmission region and a light non-transmission region, the photosensitive device includes a plurality of photosensitive modules arranged in an array, scanning lines each corresponding to and electrically connected to one row of the photosensitive modules, and read lines each corresponding to and electrically connected to one column of the photosensitive modules, the plurality of photosensitive modules are divided into n photosensitive module groups, where n is equal to or greater than 1, the touch sensitive device includes n touch sensitive electrodes, and the packaging jointing surface is a surface of the packaging substrate, and the forming a photosensitive device and a touch sensitive device on a preset packaging jointing surface includes:
  forming the n touch sensitive electrodes on the surface of the packaging substrate;
  forming the plurality of photosensitive modules in a target area of the surface of the packaging substrate formed with the n touch sensitive electrodes, such that each of the photosensitive modules is superposed on and electrically connected to one of the touch sensitive electrodes, the target area being an orthographic projection area of the light non-transmission region of the array substrate on the packaging substrate; and
  forming scanning lines each corresponding to and electrically connected to one row of the photosensitive modules, and read lines each corresponding to and electrically connected to one column of the photosensitive modules, on the surface of the packaging substrate formed with the plurality of photosensitive modules.

In an embodiment, a display area of the array substrate includes a light transmission region and a light non-transmission region, the photosensitive device includes a plurality of photosensitive modules arranged in an array, scanning lines each corresponding to and electrically connected to one row of the photosensitive modules, and read lines each corresponding to and electrically connected to one column of the photosensitive modules, the plurality of photosensitive modules are divided into n photosensitive module groups, where n is equal to or greater than 1, the touch sensitive device includes n touch sensitive electrodes, and the packaging jointing surface is the light-exiting surface of the array substrate, and the forming a photosensitive device and a touch sensitive device on a preset packaging jointing surface includes:
  forming the plurality of photosensitive modules within the light non-transmission region of the light-exiting surface of the array substrate;
  forming scanning lines each corresponding to and electrically connected to one row of the photosensitive modules, and read lines each corresponding to and electrically connected to one column of the photosensitive modules, on the light-exiting surface of the packaging substrate formed with the plurality of photosensitive modules; and
  forming the n touch sensitive electrodes on the light-exiting surface of the packaging substrate formed with the scanning lines and the read lines, such that each of the photosensitive module is superposed on and electrically connected to one of the touch sensitive electrodes.

In an embodiment, each of the photosensitive modules includes a photosensitive sub-module and a switch sub-module, and
  forming the photosensitive module, includes:
    forming the photosensitive sub-module on the packaging jointing surface; and
    forming the switch sub-module on the packaging jointing surface formed with the photosensitive module.

In an embodiment, the photosensitive sub-module includes a first electrode and a photosensitive material layer, the switch sub-module is a thin film transistor having a gate electrically connected to the scanning line, and the packaging jointing surface is a surface of the packaging substrate, and
  forming a photosensitive sub-module on the packaging jointing surface includes:
    forming the photosensitive material layer and the first electrode sequentially on the surface of the packaging substrate formed with the touch sensitive electrode; and
  the touch sensitive electrode and the first electrode both contact the photosensitive material layer, one of a source electrode and a drain electrode of the thin film transistor is electrically connected to the read line, and the other of the source electrode and the drain electrode of the thin film transistor is electrically connected to the first electrode of the photosensitive sub-module.

In an embodiment, the photosensitive sub-module includes a first electrode and a photosensitive material layer, and the switch sub-module is a thin film transistor having a gate connected to the scanning line, and the packaging jointing surface is the light-exiting surface of the packaging substrate,
  forming the photosensitive sub-module on the packaging jointing surface includes:
    forming the photosensitive material layer and the first electrode sequentially on the light-exiting surface of the packaging substrate; and
  the touch sensitive electrode and the first electrode both contact the photosensitive material layer, one of a source electrode and a drain electrode of the thin film transistor is connected to the read line, and the other of the source electrode and the drain electrode of the thin film transistor is connected to first electrode of the photosensitive sub-module.

In an embodiment, after forming the photosensitive device and the touch sensitive device on the preset packaging jointing surface, the method further comprises:
  forming a flexible circuit board, which is respectively electrically connected with the scanning lines and the read lines, on the packaging jointing surface formed with the photosensitive device and the touch sensitive device.

In an embodiment, after forming a photosensitive device and a touch sensitive device on the preset packaging jointing surface, the method further comprises:
  forming an integrated circuit, which is respectively electrically connected to the scanning lines and the read lines, on the packaging jointing surface formed with the photosensitive device and the touch sensitive device.

In an embodiment, forming the first electrode includes forming a reflecting electrode by a reflective material, and the method further comprises providing a circular polarizer on a side of the packaging substrate facing away from the photosensitive device and the touch sensitive device.

According to a third aspect of the present disclosure, there is provided a display apparatus comprising the above mentioned display panel.

Embodiments of the present disclosure provide a display panel and a method of manufacturing the same, as well as a display apparatus. The photosensitive device and the touch sensitive device are formed between the packaging substrate and the array substrate of the display panel, the touch sensitive device is positioned between the photosensitive device and the packaging substrate, and the photosensitive device and the touch sensitive device are used for achieving the touch control function and the fingerprint identifying function. Compared with the prior arts, the display panel can achieve the fingerprint identification function and the touch control function at the same time, enriching the functions of the display panel.

It should be appreciated that the above mentioned general description and detailed description hereafter are only exemplary and explanatory, and do not limit the present disclosure.

BRIEF DESCRIPTION OF THE DRAWINGS

In order to clearly explain the technical solutions of embodiments of the present disclosure, the drawings used in the description of embodiments are now simply introduced. Obviously, the drawings in the following description are just some of embodiments of the present disclosure. Of course, some other drawings may be also obtained for the skilled person in the art from these drawings without any creative effort.

DETAILED DESCRIPTION OF PREFERRED EMBODIMENTS

Figure 1A:
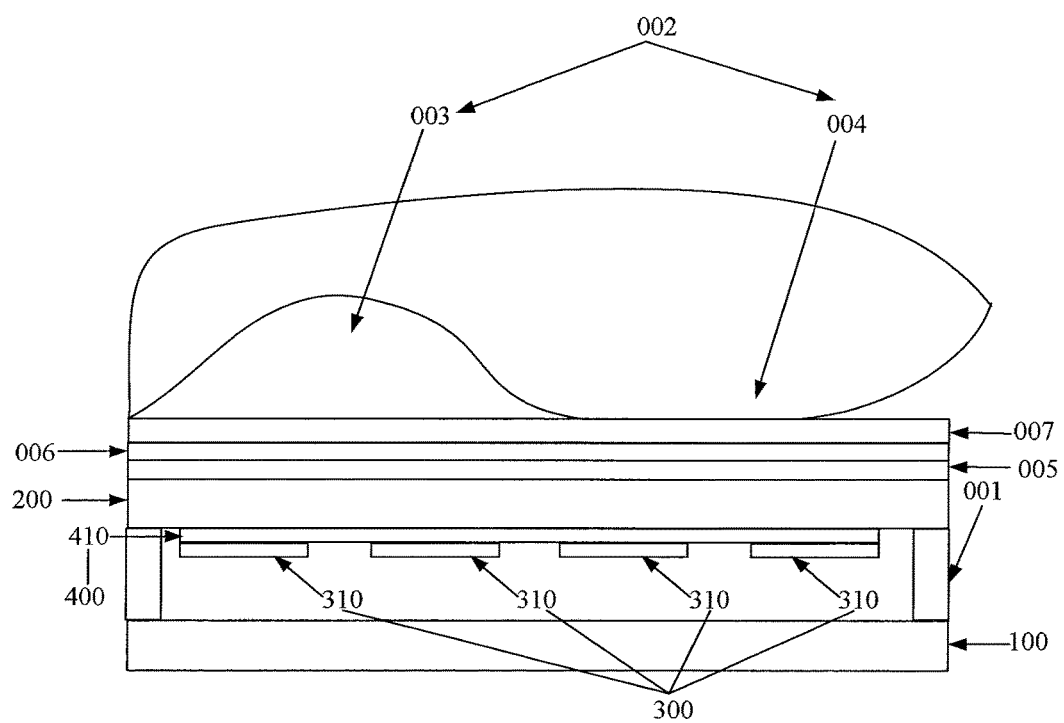
FIG. 1A is a structural schematic view of a display panel provided by an embodiment of the present disclosure.

In order to make objects, technical schemes and advantages of the present disclosure more definite, embodiments of the present disclosure will be further described in detail with reference to the drawings. In this description, like or similar reference numerals refer to like or similar elements. Description of the embodiments of the present disclosure made with reference to the drawings tends to describe general concepts of the disclosure, and should not be understood as being limitative to the present disclosure.

Further, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An embodiment of the present disclosure provides a display panel, such as a OLED display panel, as shown in FIG. 1, comprising an array substrate 100, and an packaging substrate 200 jointed to or assembled with the array substrate 100, a photosensitive device 300, and a touch sensitive device 400.

In an example, the photosensitive device 300 and the touch sensitive device 400 are formed between the packaging substrate 200 and the array substrate 100, and the touch sensitive device 400 is positioned between the photosensitive device 300 and the packaging substrate 200.

With the display panel of embodiments of the present disclosure, the photosensitive device and the touch sensitive device are formed between the packaging substrate and the array substrate of the display panel, the touch sensitive device is positioned between the photosensitive device and the packaging substrate, and the photosensitive device and the touch sensitive device are used for achieving the touch control function and the fingerprint identifying function. Compared with the prior arts, the display panel can achieve the fingerprint identification function and the touch control function at the same time, enriching the functions of the display panel.

Illustratively, the touch sensitive device 400 is used to determine information about a position at which the display panel is touched by a user's finger, and the photosensitive device 300 is used to receive a light signal reflected by a fingerprint pattern of user's finger and based on the light signal, generate a current signal for identifying the fingerprint pattern.

In an embodiment, reference sign 001 in FIG. 1 indicates a sealing agent, such as glass cement or frit, reference sign 005 indicates a circular polarizer (POL), reference sign 006 indicates optically clear adhesive (OCA), reference sign 007 indicates a protective substrate. The description of the sealing agent 001, the OCA 006 and the protective substrate 007 may refers to the prior art and will not be repeated herein. In FIG. 1A, Reference sign 002 indicates a finger, reference sign 003 indicates a fingerprint valley, and reference sign 004 indicates a fingerprint ridge.

It should be noted that the fingerprint is an inherent, unique and unchangeable characteristic which can be differentiated from those of other people. The fingerprint is composed of a series of fingerprint ridges and fingerprint valleys on a skin surface of the end of the finger, whose composition detail generally include a branching of the fingerprint ridge, an end of the fingerprint ridge, an arch, an tent arch, a levorotation, a right-handed rotation, helix, or a bispin, and so on, which determines the uniqueness of the fingerprint pattern. Since the refractive index of the fingerprint ridge is different from that of the fingerprint valley, then light intensity reflected by the fingerprint ridge is different from that reflected by the fingerprint valley, thus, the light signal reflected by the fingerprint ridge is different from that reflected by the fingerprint valley, and finally, the current signal generated by the photosensitive device is varied, therefore, the position of the fingerprint ridge and the fingerprint valley can be determined on the basis of the current signal, and the fingerprint identifying function can be achieved. Specifically, the fingerprint pattern can be determined on the basis of the positions of the fingerprint ridge and the fingerprint valley, and then it can be compared with a fingerprint pattern prestored in a fingerprint base. User can operate the display apparatus if the fingerprint pattern and the prestored fingerprint pattern are identical to each other, and the user cannot operate the display apparatus if they are different.

Figure 1B:
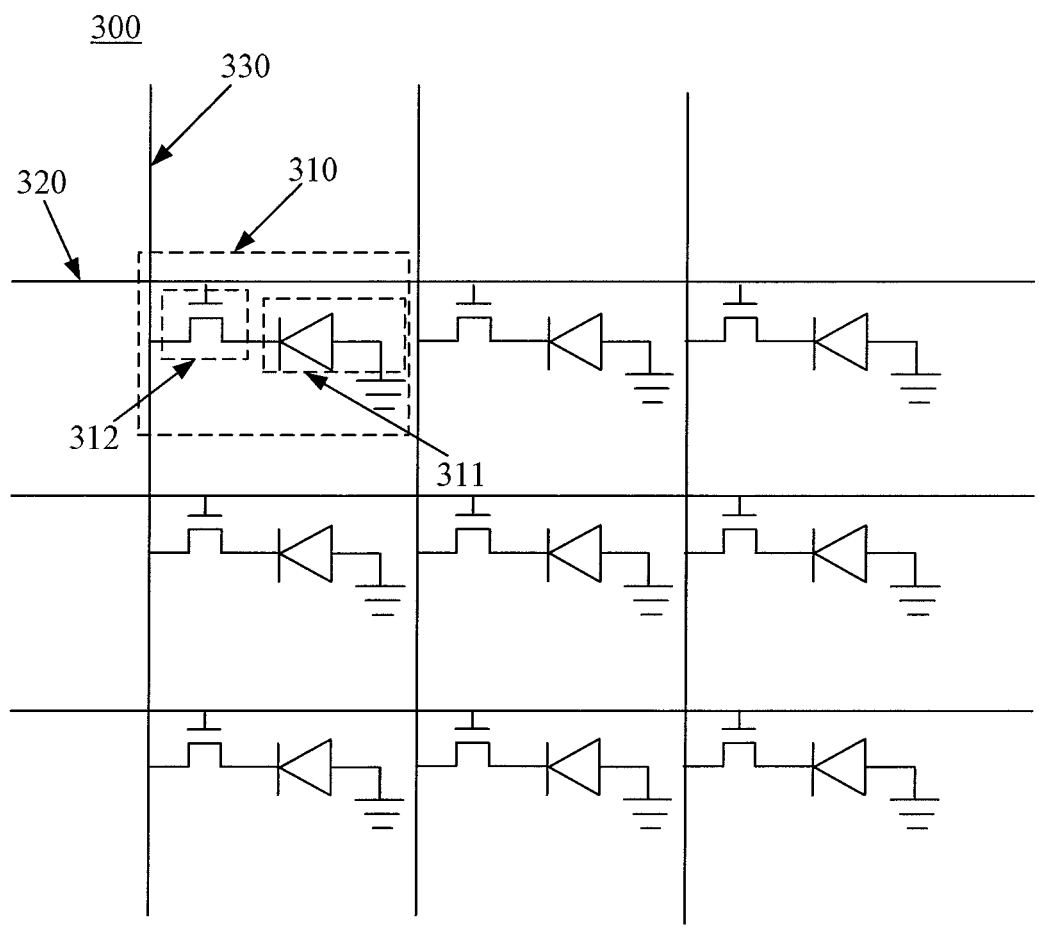
FIG. 1B is a structural schematic view of a photosensitive device provided by an embodiment of the present disclosure.

In an embodiment, as shown in FIG. 1A and FIG. 1B, the photosensitive device 300 includes a plurality of photosensitive modules 310 arranged in an array, scanning lines 320 each corresponding to and electrically connected to one row of the photosensitive module 310, and read lines 330 each corresponding to and electrically connected to one column of the protosensitive module 310. Each photosensitive module 310 is used to output a current signal through a corresponding read line 330 under a scanning signal output by a corresponding scanning line 320.

Figure 1C:
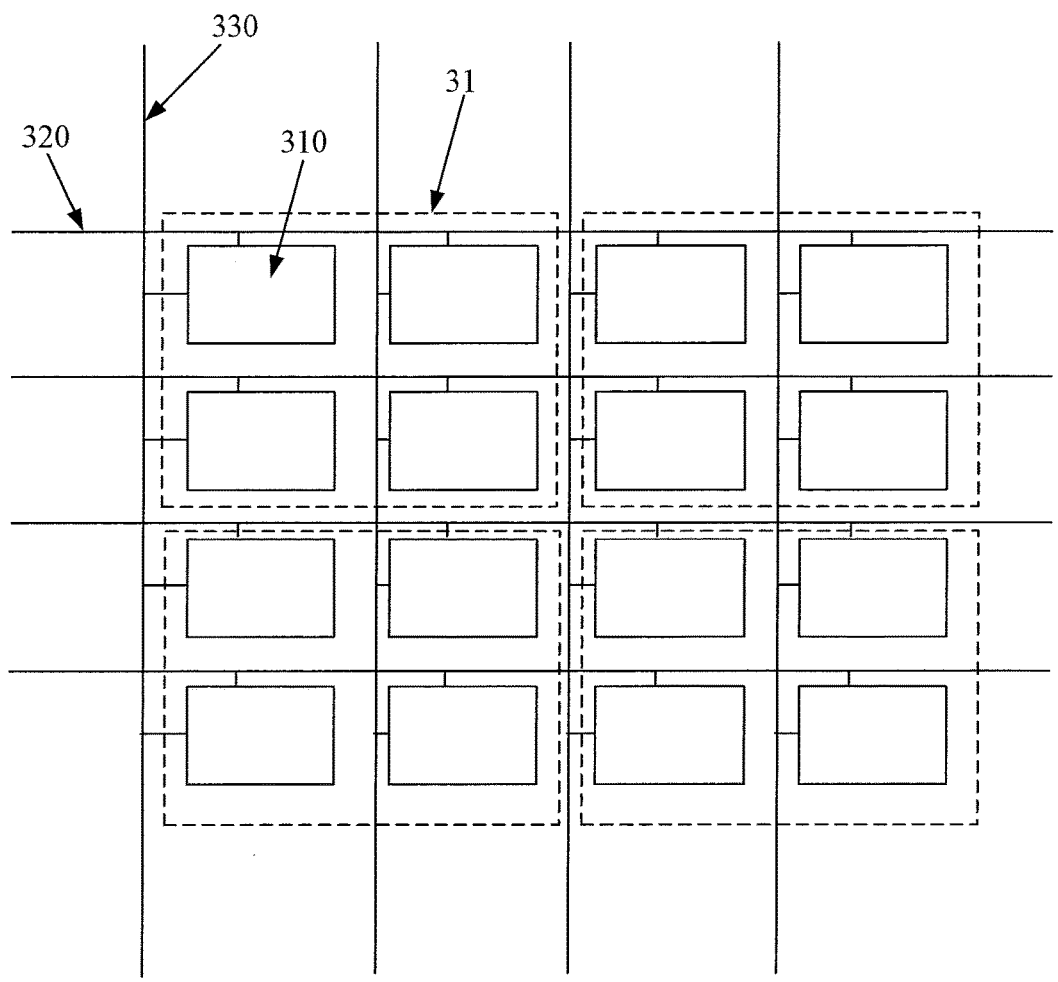
FIG. 1C is a structural schematic view of a plurality of-photosensitive device group provided by an embodiment of the present disclosure.

As shown in FIG. 1C, a plurality of photosensitive modules 310 are divided into or grouped into n photosensitive module groups 31, where n is equal to or greater than 1. n in FIG. 1C is taken 4 as an example. In FIG. 1C, reference sign 320 indicates the scanning line, and reference sign 330 indicates the read line.

As shown in FIG. 1A, the touch sensitive device 400 includes n touch sensitive electrodes 410. It should be noted that only one touch sensitive electrode is depicted in FIG. 1A.

Each photosensitive module group 31 in FIG. 1C is superposed on and connected with a touch sensitive electrode. The touch sensitive electrode of embodiments of the present disclosure is a self-capacitance electrode for achieving the touch control function. The touch sensitive electrode is made of a transparent conductive material. For example, the transparent conductive material may be Indium Tin Oxide (ITO). For example, the touch sensitive electrode and the earth constitutes a capacitance (self-capacitance), that is to say, a capacitance of the touch sensitive electrode with respect to the ground. When the user's finger touches the display panel, the capacitance of the finger is overlaid on the capacitance of the display panel to increase the capacitance of the display panel, such that touch coordinates of the finger on the display panel can be determined according to a change in capacitance of the display panel before and after being touched by the finger, thereby determining the information about the position at which the user's finger touches the display panel. The self-capacitance and the touch control process may refer to the prior art, and will not repeated herein.

In an embodiment, as shown in FIG. 1B, each photosensitive module 310 includes a photosensitive sub-module 311 and a switch sub-module 312. The switch sub-module 312 is electrically connected with the scanning line 320, the read line 330 and the photosensitive sub-module 311 respectively. The photosensitive sub-module 311 is electrically connected with a corresponding touch electrode. The switch sub-module is turned on under the control of the scanning line, and when the switch sub-module is turned on, the photosensitive sub-module is used to output the current signal through the read line, for example output to a signal processing component, in order to identify the fingerprint pattern by the signal processing component based on the current signal.

Figure 1D:
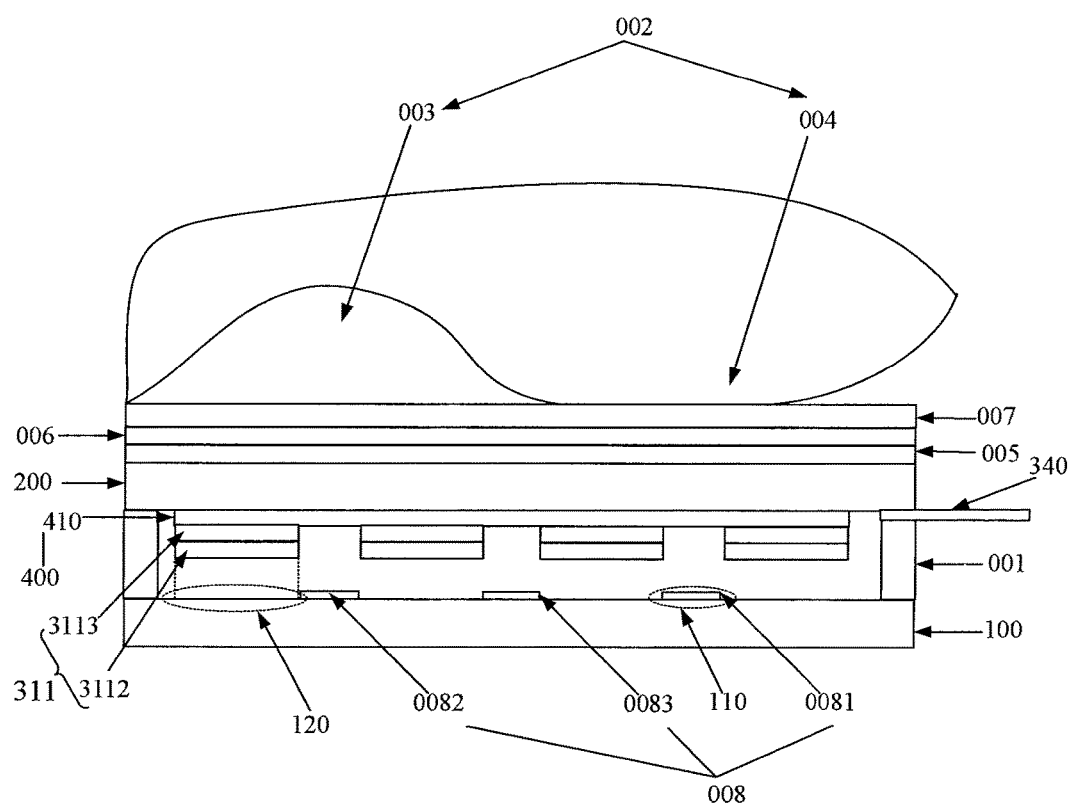
FIG. 1D is a structural schematic view of another display panel provided by an embodiment of the present disclosure.

As shown in Fig. D, the photosensitive sub-module includes a first electrode 3112, and a photosensitive material layer 3113 formed between the touch sensitive electrode 410 and the first electrode 3112. In an embodiment, the first electrode is a reflecting electrode, such as an electrode made of metal or other reflective material, which is used to reflect the light reflected by the fingerprint pattern, as described below. The touch sensitive electrode 410 and the first electrode 3112 both contact the photosensitive material layer 3113. The touch sensitive electrode and the first electrode are used to power the photosensitive material layer, so that when the photosensitive material layer receives the light signal reflected by the fingerprint pattern at a touch position, the photosensitive material layer can generate a current signal based on the light signal, thereby achieving the fingerprint identifying function. Reference sign 008 in FIG. 1D indicates a pixel, a region corresponding to the pixel is a light transmission region of the array substrate. The array substrate includes a display area and a non-display area, the non-display area for example is an area where a frame of the display apparatus is positioned, and a region except the non-display area is the display area. The display area includes a light transmission region and a light non-transmission region, which is a region in the display area except the light transmission region. For example, as shown in FIG. 1D, a pixel 008 may include three sub-pixels with different colors. The three sub-pixels with different colors include a red sub-pixel 0081, a green sub-pixel 0082 and a blue sub-pixel 0083. Meanings of other reference signs in FIG. 1D may refer to the description made with respect to FIG. 1A.

In an embodiment, as shown in FIG. 1B, the switch sub-module 312 is a thin film transistor, a gate of the thin film transistor is electrically connected to the scanning line 320, one of a source electrode and a drain electrode of the thin film transistor is electrically connected to the read line 330, and the other of the source electrode and the drain electrode of the thin film transistor is electrically connected to the first electrode 3112 of the photosensitive sub-module 311.

Figure 1E:
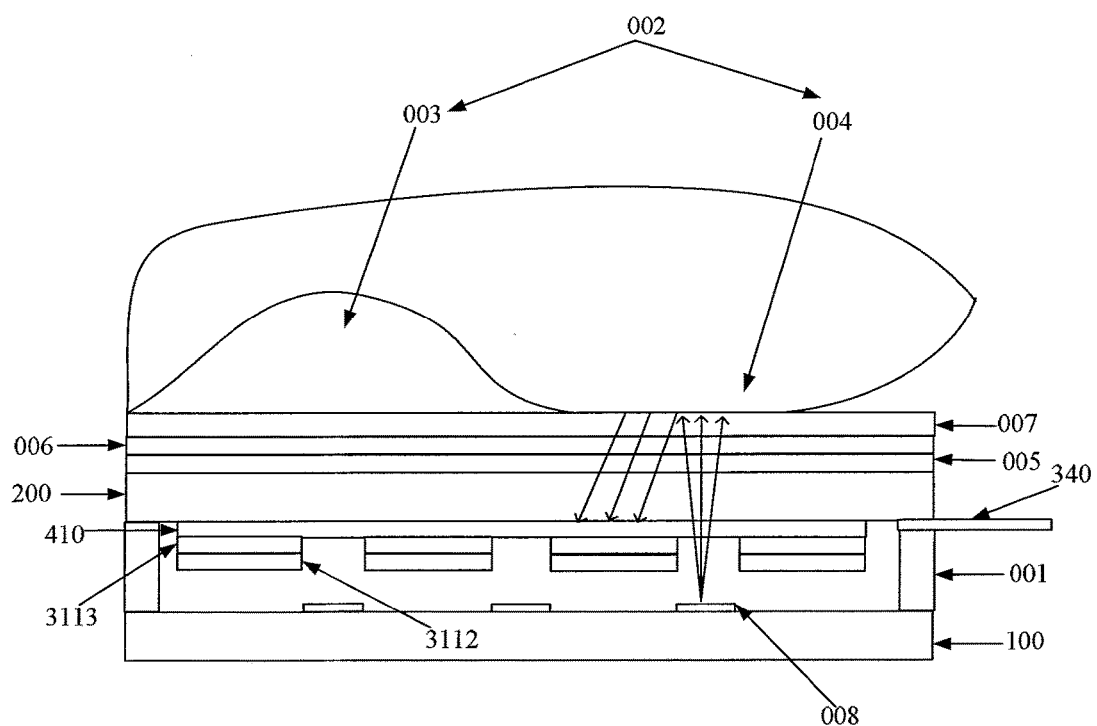
FIG. 1E is a schematic view of a display panel identifying a fingerprint ridge provided by an embodiment of the present disclosure.

FIG. 1E shows a schematic view of a display panel identifying a fingerprint ridge provided by an embodiment of the present disclosure. As shown in FIGS. 1B and 1E, when the user touch the display panel, firstly, the information about a position at which the user's finger touches the display panel is determined through the touch sensitive electrode 410, then the photosensitive material layer 3113 receives a light signal reflected by a fingerprint pattern of the user's finer corresponding to the position information determined by the touch sensitive electrode 410, and generates a current signal under the action of voltages provided by the touch sensitive electrode 410 and the first electrode 3112. Since the intensity of light reflected by the fingerprint ridge is different from the intensity of light reflected by the fingerprint valley, the light signal reflected by the fingerprint ridge is different from the light signal reflected by the fingerprint valley, and finally the current signal generated by photosensitive material layer 3113 is varied. Thus, the position of a fingerprint ridge can be determined by the current signal. The thin film transistor (not shown in FIG. 1E) is turned on under control of the scanning line 320, so the photosensitive material layer 3113 can output the generated current signal through the read line 330 so that a signal processing component determines the fingerprint pattern based on the current signal and compares the fingerprint pattern with a prestored fingerprint pattern prestored in a fingerprint base, and then the user can operate the display apparatus if the fingerprint pattern and the prestored fingerprint pattern are identical to each other. In an embodiment, a touch control period and a fingerprint identifying period of the display panel may be executed in a time-sharing manner. Other reference signs in FIG. 1E may refer to the description made with respect to FIG. 1D.

Figure 1F:
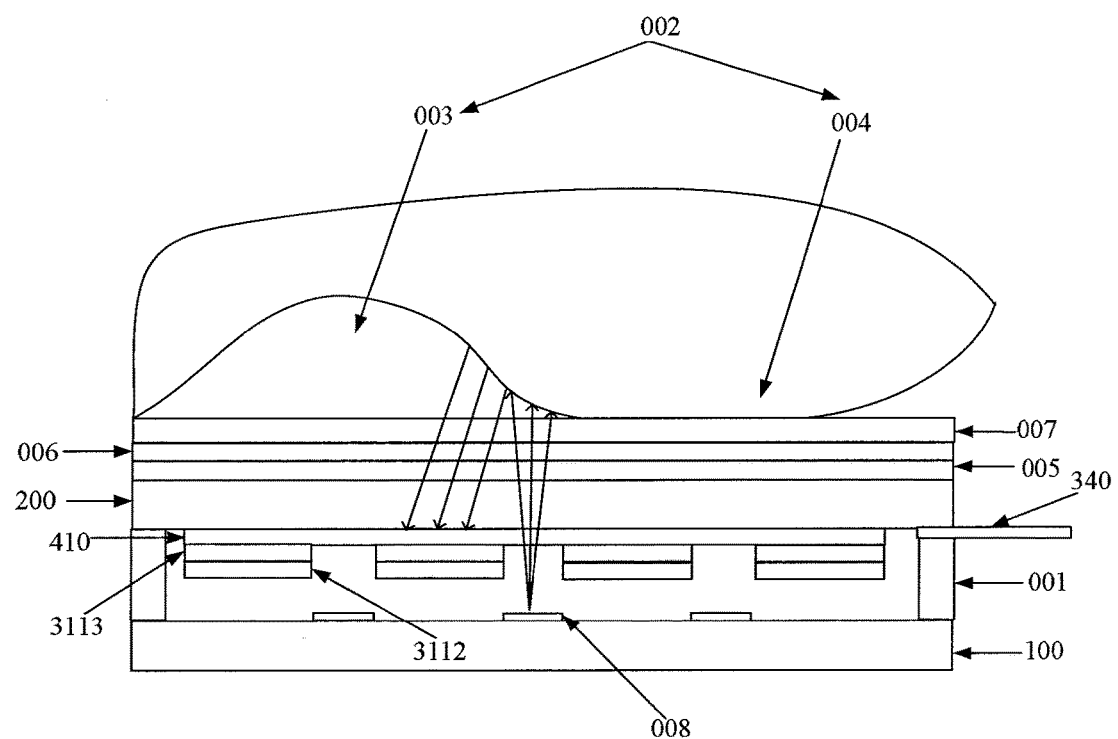
FIG. 1F is a schematic view of a display panel identifying a fingerprint valley provided by an embodiment of the present disclosure.

FIG. 1F shows a schematic view of a display panel identifying a fingerprint valley provided by an embodiment of the present disclosure. The process for identifying the fingerprint valley by the display panel may refer to the description made with respect to FIG. 1E. Likewise, since the intensity of light reflected by the fingerprint ridge is different from the intensity of light reflected by the fingerprint valley, the light signal reflected by the fingerprint ridge is different from the light signal reflected by the fingerprint valley, and finally the current signal generated by the photosensitive material layers 3113 is varied. Thus, the position of a fingerprint valley can be determined by means of the current signal. Other reference signs in FIG. 1F may refer to the description made with respect to FIG. 1D.

It should be noted that the display panel provided by embodiments of the present disclosure may determine the information about the position at which the user's finger touches the display panel and achieves the touch control function through the touch sensitive device in a self-capacitance manner, or uses the photosensitive device as an optical touch sensitive electrode and determines the information about the position at which the user's finger touches the display panel so as to achieve the touch control function through the photosensitive device. For example, photosensitive device(s) located within a 5 mm×5 mm area may be taken as an optical touch sensitive electrode. When the user's finger touches the display panel, the optical touch sensitive electrode would generate a current signal after receiving the light signal reflected by the fingerprint pattern, and determine the position of the fingerprint ridge and the fingerprint valley based on the current signal and further determine the information about the position at which the user's finger touches the display panel so as to achieve the touch control function, since the light signal reflected by the fingerprint ridge is different from the light signal reflected by the fingerprint valley, and the current signals generated based on the light signal are different from each other.

In an embodiment, as shown in FIG. 1D, the display panel also includes a flexible circuit board 340 electrically connected with the scanning lines and the read lines. The scanning lines and the read lines in the display panel are electrically connected to an external circuit through the flexible circuit board. For example, the flexible circuit board can electrically connect the scanning lines with a signal providing component to send the scanning signal generated by the signal providing component to the scanning lines; and the flexible circuit board can electrically connect the read lines with a signal processing component to send the current signal received by the read lines to the signal processing component. Alternatively or additionally, the display panel may include an integrated circuit (IC) electrically connected with the scanning lines and data lines; that is to say, in an embodiment of the present disclosure, the scanning lines and the read lines in the display panel may be electrically connected with an external circuit through the IC.

As shown in FIG. 1D, the display area of the array substrate 100 includes a light transmission region 110 and a light non-transmission region 120. The orthographical projection of the plurality of photosensitive modules on the array substrate 100 is positioned within the light non-transmission region 120 of the array substrate 100. Arrangement of the photosensitive module within a region corresponding to the light non-transmission region of the array substrate avoids an adverse effect on the image displayed by the photosensitive module.

Figure 1G:
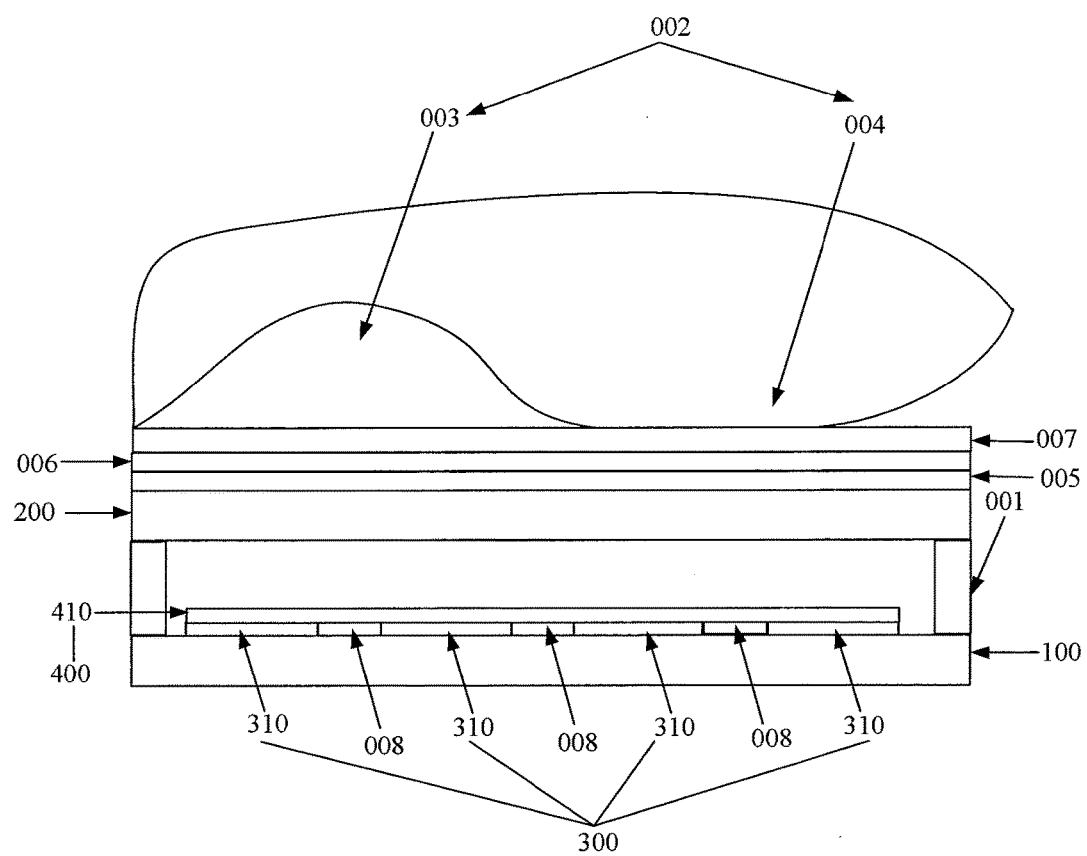
FIG. 1G is a structural schematic view of a further display panel provided by an embodiment of the present disclosure.

It should be also note that the photosensitive device and the touch sensitive device of the display panel provided by embodiments of the present disclosure may be formed on the light-exiting surface of the array substrate, as shown in FIG. 1G, insteading of being formed on a surface of the packaging substrate. Other reference signs in FIG. 1G may refer to the description made with reference to FIG. 1A.

Against the problem existing in the prior art that OLED display panel of the display apparatus cannot achieve the fingerprint identifying function and the touch control function at the same time, embodiments of the present disclosure provide a display panel with a photosensitive device and a touch sensitive device, which can achieve the touch sensitive device function and the fingerprint identifying function at the same time through the photosensitive device and the touch sensitive device.

Figure 1H:
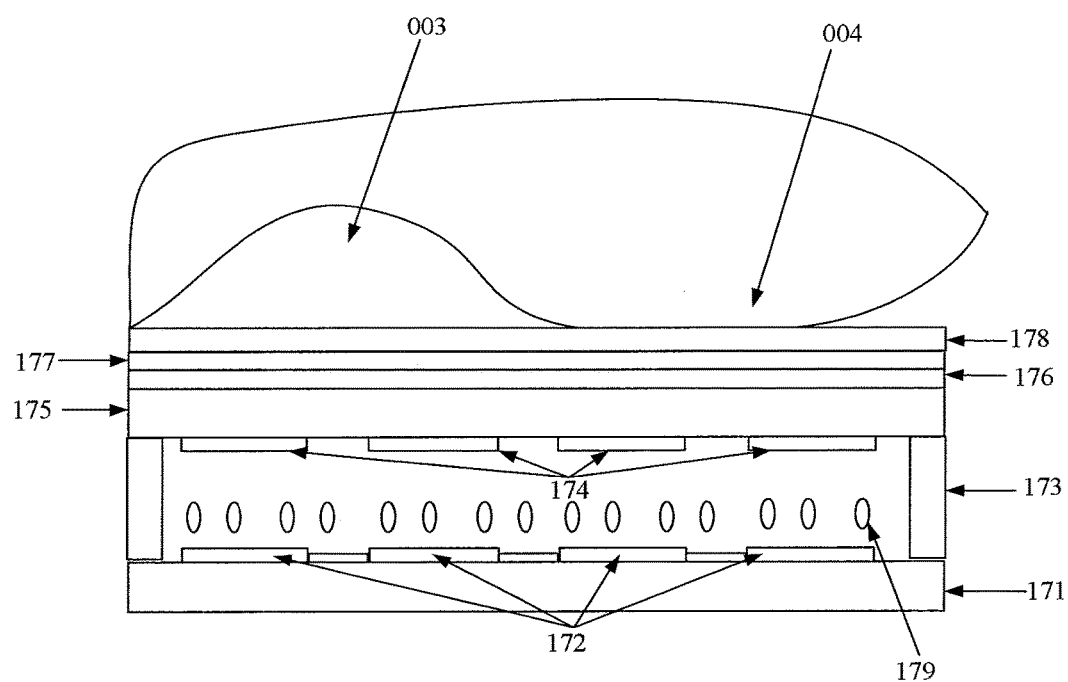
FIG. 1H is a structural schematic view of a LCD display panel in the prior art.
Figure 1I:
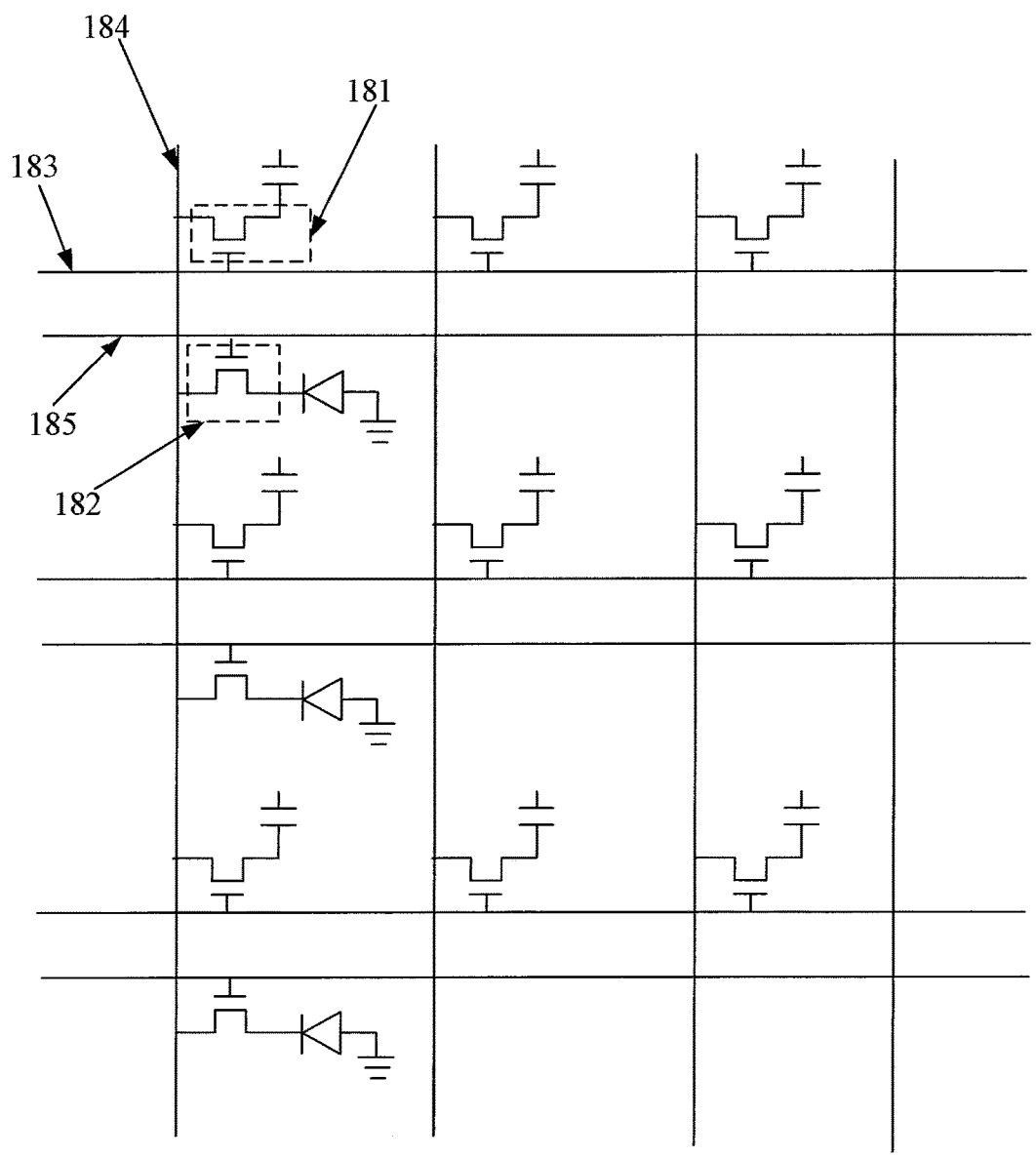
FIG. 1I is a schematic view of arrangement of a fingerprint identification device of the LCD display panel shown in FIG. 1H on the array substrate.

FIG. 1H shows a structural schematic view of a Liquid Crystal Display (LCD) display panel in the prior art. As shown in FIG. 1H, the array substrate 117 of the display panel is formed with a fingerprint identification device 172 including a photosensitive device and a touch sensitive device. In FIG. 1H, reference sign 173 indicates a sealant, reference sign 174 indicates a black matrix, reference sign 175 indicates a color filter (CF) substrate, reference sign 176 indicates a polarizer, reference sign 177 indicates an OCA, reference sign 178 indicates a protective substrate, reference sign 179 indicates liquid crystal, reference sign 004 indicates a fingerprint ridge, and reference sign 003 indicates a fingerprint valley. FIG. 1I is a schematic view of arrangement of the fingerprint identification device of the LCD display panel shown in FIG. 1H on the array substrate. It is noted that although the LCD display panel can achieve the touch control function and the fingerprint identifying function at the same time, there are following differences between the LCD display panel and the display panel provided by embodiments of the present disclosure:

1) The thickness of the LCD display panel is greater, while the thickness of the display panel provided by embodiments of the present disclosure is smaller, without changing an original sealant packaging structure;

2) Located below the fingerprint identification device is a metal or reflecting electrode, resulting in that the light reflected by the fingerprint pattern will be reflected away again by the metal or reflecting electrode, the polarizer 176 is used to cooperate with the liquid crystal 179 to display image; thus, the light will exits the display panel through the polarizer 176 and then affect the display when the light reflected by the fingerprint pattern is reflected again by the metal or reflecting electrode and if there is not a black matrix 174 in the LCD display panel Thus, the black matrix 174 is required to be formed in the LCD display panel to block the light reflected by the metal or reflecting electrode, in order to avoid light reflected by the first electrode from exiting the display panel. Therefore, the structure of the LCD display panel is more complex than that of the display panel provided by embodiments of the present disclosure, since the circular polarizer of the display panel provided by embodiments of the present disclosure itself has an anti-reflecting effect, that is to say, when light reflected by the fingerprint pattern is reflected by the above first electrode, the light cannot exit the display panel through the circular polarizer, the display panel provided by embodiments of the present disclosure therefore need not any additional light blocking component, and its structure is more simple;

3) Since the fingerprint identification device of the LCD display panel is formed on the array substrate, as shown in FIG. 1I, the array substrate is also formed with a photosensitive thin film transistor 182 (used to achieve the touch control function and the fingerprint identifying function) in addition to being formed with a driving thin film transistor 181 (used for display), so the number of the signal lines (which includes a gate line 183, a data line 184 and a scanning line 185) on the array substrate is greater and the structure of the array substrate is more complex; while in the display panel provided by embodiments of the present disclosure, the number of the signal lines on the array substrate (which includes a gate line and a data line) is smaller because the photosensitive device and the touch sensitive device are formed on a surface of the packaging substrate, and the scanning line is formed on a surface of the packaging substrate, thus the structure of the array substrate is simplified;

4) Since the LCD display panel includes the liquid crystal and the black matrix, which both result in a loss of the light signal reflected by the fingerprint pattern and finally result in a lower accuracy of the fingerprint identification device based on the current signal generated on the light signal, thus the accuracy of the fingerprint identification is lower; compared to the LCD display panel, the display panel provided by embodiment of the present disclosure does not include the liquid crystal and the black matrix, so the loss of the light signal is less than that caused by the LCD display panel, and the use of the light signal reflected by the fingerprint pattern can be maximized, therefore, the display panel enhances the accuracy of determining the current signal and the accuracy of the fingerprint identification; and 5) As shown in FIG. 1I, in the LCD display panel, one column of the driving thin film transistor 181 and the photosensitive thin film transistor 182 share a data line, thus the display period and the touch control period of the LCD display panel cannot be independent of each other, and should be driven in a time-sharing manner; while in the display panel provided by embodiments of the present disclosure, the photosensitive device and the touch sensitive device may be formed on a surface of the packaging substrate, and the display operation of the driving thin film transistor on the array substrate is independent of the touch control and fingerprint identification operations of the thin film transistor on the surface of the packaging substrate, accordingly, the display period and the touch control period may be performed at the same time without needing to be driven in a time-sharing manner.

It is also noted that like the fingerprint of the user's finger, the palmprint of user's palm is also composed of a series of ridges and valleys, whose composition detail also includes a branching of the fingerprint ridge and so on, which determines the uniqueness of the palmprint pattern. Since the refractive index of the palmprint ridge is different from that of the palmprint valley, then when the pixel is turned on, light intensity reflected by the palmprint ridge is different from that reflected by the palmprint valley, thus, the light signal reflected by the fingerprint ridge is different from that reflected by the palmprint valley, and finally, the current signal generated by the photosensitive device is varied; therefore, the display panel provided by embodiments of the present disclosure is also applicable for palmprint identification, so as to achieve the palmprint identification function, which may be performed in the same operation as that of the fingerprint identification and will be repeated herein.

As described above, with the display panel of embodiments of the present disclosure, the photosensitive device and the touch sensitive device are formed between the packaging substrate and the array substrate of the display panel, the touch sensitive device is positioned between the photosensitive device and the packaging substrate, and the photosensitive device and the touch sensitive device are used for achieving the touch control function and the fingerprint identifying function. Compared with the prior arts, the display panel can achieve the fingerprint identification function and the touch control function at the same time, enriching the functions of the display panel.

Figure 2A:
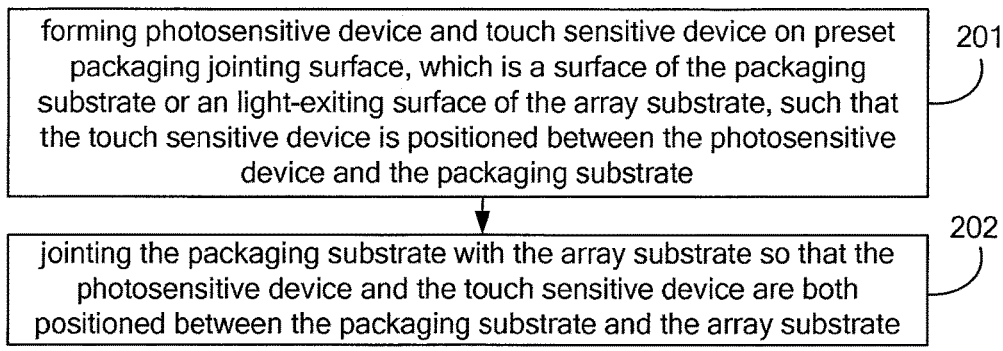
FIG. 2A is a flow chart of a method of manufacturing a display panel provided by an embodiment of the present disclosure.

An embodiment of the present disclosure also provide a method of manufacturing a display panel, as shown in FIG. 2A, comprising:

Step 201: forming a photosensitive device and a touch sensitive device on a preset packaging jointing surface, which is a surface of a packaging substrate or a light-exiting surface of an array substrate, such that the touch sensitive device is positioned between the photosensitive device and the packaging substrate.

When the packaging jointing surface is a surface of the packaging substrate, as shown in FIG. 1A, the photosensitive device 300 and the touch sensitive device 400 are formed on the surface of the packaging substrate 200.

When the packaging jointing surface is the light-exiting surface of the array substrate, as shown in FIG. 1G, the photosensitive device 300 and the touch sensitive device 400 are formed on the light-exiting surface of the array substrate 100.

The method also comprises a step 202: jointing or assembling the packaging substrate with the array substrate, so that the photosensitive device and the touch sensitive device are both positioned between the packaging substrate and the array substrate.

The packaging and jointing process of the packaging substrate and the array substrate is not limited in embodiments of the present disclosure.

As described above, in the method of manufacturing a display panel provided by embodiments of the present disclosure, the photosensitive device and the touch sensitive device are formed on a surface of the packaging substrate or on the light-exiting surface of the array substrate, and the touch sensitive device is positioned between the photosensitive device and the packaging substrate. The photosensitive device and the touch sensitive device are used to achieve the touch control function and the fingerprint identifying function, thus when compared with the prior art, the display panel can achieve the fingerprint identifying function and the touch control function at the same time, which enriches the functions of the display panel.

In an embodiment, as shown in FIG. 1D, the display area of the array substrate 100 includes a light transmission region 110 and a light non-transmission region 120. As shown in FIG. 1A and FIG. 1B, the photosensitive device 300 includes a plurality of photosensitive modules 310 arranged in an array, scanning lines 320 each corresponding to and electrically connected to one row of the photosensitive module 310, and read lines 330 each corresponding to and electrically connected to one column of the protosensitive module 310.

As shown in FIG. 1C, the plurality of photosensitive modules 310 are divided into or grouped into n photosensitive module groups 31, where n is equal to or greater than 1. As shown in FIG. 1A, the touch sensitive device 400 includes n touch sensitive electrodes 410. In an example, the touch sensitive electrode is made of a transparent conductive material. For example, the transparent conductive material may be Indium Tin Oxide (ITO).

Figure 2B:
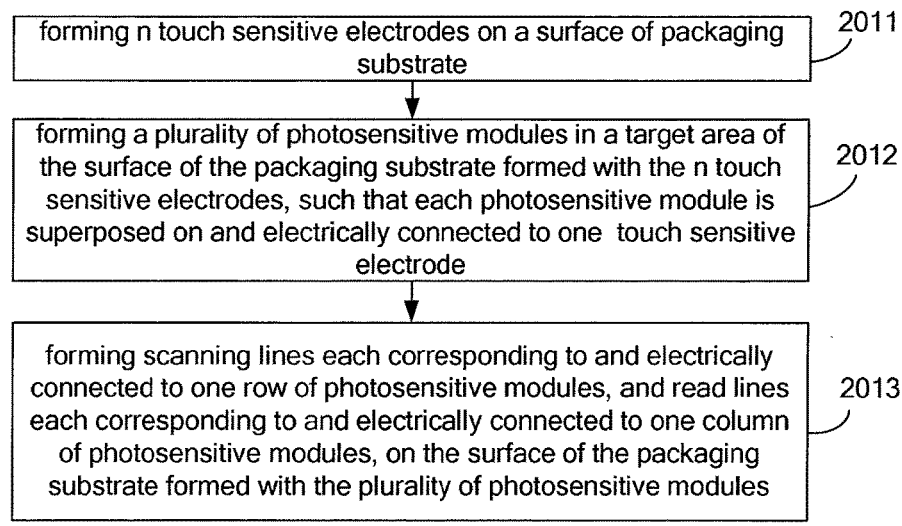
FIG. 2B is a flow chart forming a photosensitive device and a touch sensitive device provided by an embodiment of the present disclosure.

When the packaging jointing surface is a surface of the packaging substrate, as shown in FIG. 2B, the step 201 may include following steps 2011, 2012 and 2013:

In step 2011, the n touch sensitive electrodes are formed on a surface of the packaging substrate.

Figure 2C:
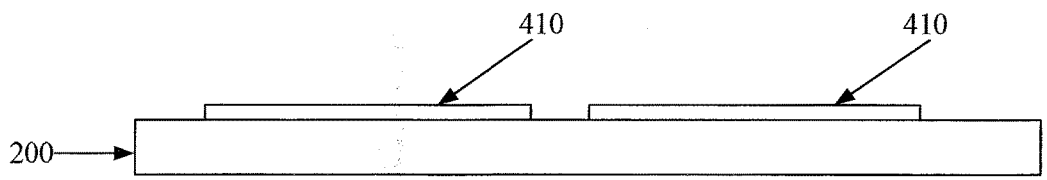
FIG. 2C is a structural schematic view of n touch sensitive electrodes formed on a surface of the packaging substrate provided by an embodiment of the present disclosure.

As shown in FIG. 2C, n touch sensitive electrodes are formed on a surface of the packaging substrate 200. n is taken 2 as an example in FIG. 2C.

In step 2012, a plurality of photosensitive modules are formed in a target area of the surface of the packaging substrate formed with the n touch sensitive electrodes, such that each photosensitive module group is superposed on and electrically connected with onetouch sensitive electrode.

Figure 2D:
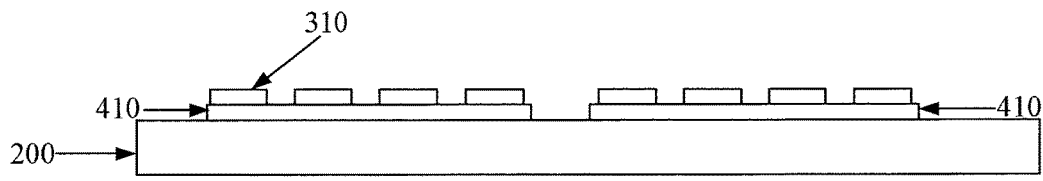
FIG. 2D is a structural schematic view of a plurality of photosensitive modules formed on a surface of the packaging substrate provided by an embodiment of the present disclosure.

The target area is an orthographic projection area of the light non-transmission region of the array substrate on the packaging substrate. As shown in FIG. 2D, the plurality of photosensitive modules 310 are formed in the target area of the surface of the packaging substrate formed with the n touch sensitive electrodes 410, such that each photosensitive module group is superposed on and electrically connected with onetouch sensitive electrode.

In step 2013, scanning lines each corresponding to and electrically connected to one row of the photosensitive modules, and read lines each corresponding to and electrically connected to one column of the photosensitive modules are formed on the surface of the packaging substrate provided with the plurality of photosensitive modules.

As shown in FIG. 1B, scanning lines 320 each corresponding to and electrically connected to one row of the photosensitive modules 310, and read lines 330 each corresponding to and electrically connected with one column of the photosensitive modules 310 are formed on the surface of the packaging substrate (not shown in FIG. 1B) provided with the plurality of photosensitive modules 310.

In an embodiment, as shown in FIG. 1B, each photosensitive module 310 includes a photosensitive sub-module 311 and a switch sub-module 312. The switch sub-module is turned on under the control of the scanning line, and the photosensitive sub-module is used to output the current signal through the read line, for example to a signal processing component, when the switch sub-module is turned on.

Figure 2E:
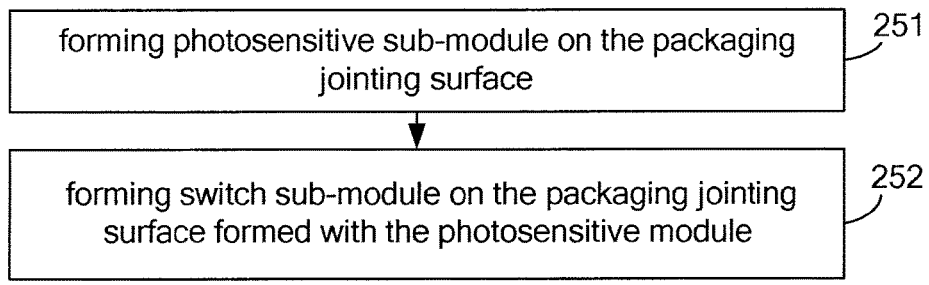
FIG. 2E is a flow chart of manufacturing a photosensitive module provided by an embodiment of the present disclosure.

Correspondingly, as shown in FIG. 2E, the process of manufacturing the photosensitive module 310 may include the following step 251 and step 252:

In step 251, the photosensitive sub-module is formed on the packaging jointing surface.

As shown in FIG. 1B, the photosensitive sub-module 311 is formed on a surface of the packaging substrate (not shown in FIG. 1B).

In step 252, the switch sub-module is formed on the packaging jointing surface formed with the photosensitive sub-module.

As shown in FIG. 1B, the switch sub-module 312 is formed on the surface of the packaging substrate formed with the photosensitive sub-module 311.

In an embodiment, as shown in FIG. 1D, the photosensitive sub-module 311 includes a first electrode 3112 and a photosensitive material layer 3113. As shown in FIG. 1B, the switch sub-module 312 is a thin film transistor, which has a gate electrically connected to the scanning line.

Correspondingly, step 251 may include: forming a photosensitive material layer and a first electrode sequentially on the surface of the packaging substrate formed with the touch controlling electrode.

In an embodiment, the photosensitive material layer contacts both the touch sensitive electrode and the first electrode, one of a source electrode and a drain electrode of the thin film transistor is connected to the read line, and the other of the source electrode and the drain electrode of the thin film transistor is connected to the first electrode of the photosensitive sub-module. As shown in FIG. 1D, a photosensitive material layer 3113 and a first electrode 3112 are formed sequentially on the surface of the packaging substrate 200 formed with the touch control electrode 410. The photosensitive material layer 3113 will receive a light signal reflected by the fingerprint pattern, and generate a current signal under voltages provided by the touch sensitive electrode 410 and the first electrode 3112, and then the generated current signal is output through the read line (such as the read line 330 in FIG. 1B) when the thin film transistor is turned on.

As shown in FIG. 1A, a plurality of photosensitive modules 310 are formed in a target area of the surface of the packaging substrate 200. As shown in FIG. 1D, the target area is the orthographic projection area of the light non-transmission region of the array substrate 200 on the packaging substrate 200.

Figure 2F:
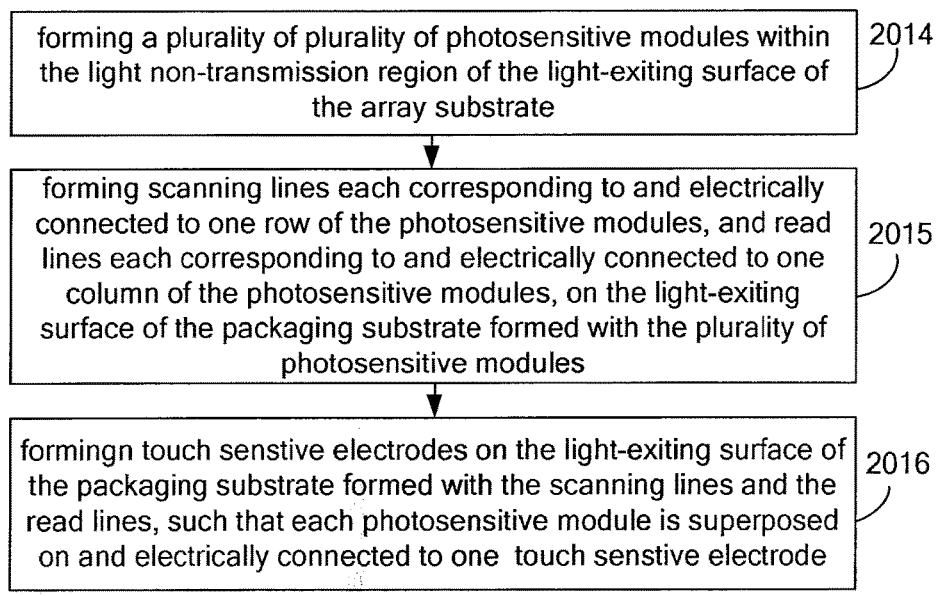
FIG. 2F is another flow chart of forming a photosensitive device and a touch sensitive device provided by an embodiment of the present disclosure.

When the packaging jointing surface is the light-exiting surface of the array substrate, as shown in FIG. 2F, step 201 may include the following steps 2014, 2015, and 2016:

In step 2014, a plurality of photosensitive modules are formed within the light non-transmission region of the light-exiting surface of the array substrate.

Figure 2G:
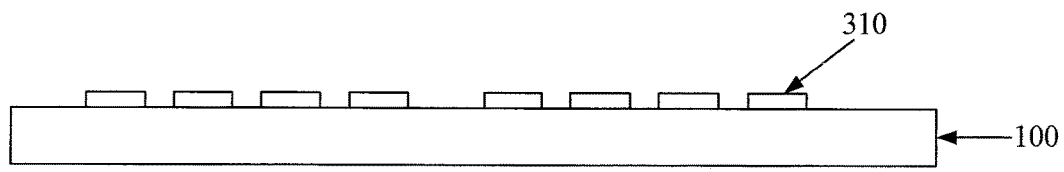
FIG. 2G is a structural schematic view of a plurality of photosensitive modules formed on a light-exiting surface of an array substrate provided by an embodiment of the present disclosure.

As shown in FIG. 2G, a plurality of photosensitive modules 310 are formed within the light non-transmission region (not shown in FIG. 2G) of the light-exiting surface of the array substrate 100.

Figure 2H:
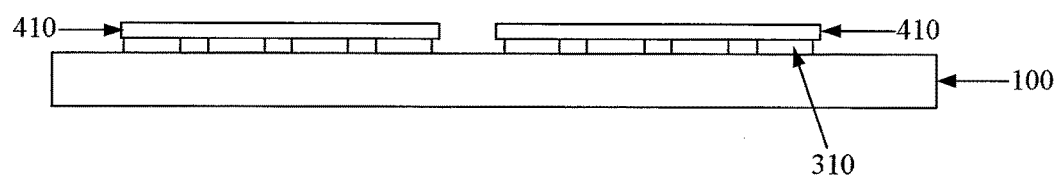
FIG. 2H is a structural schematic view of n touch sensitive electrodes formed on a light-exiting surface of an array substrate provided by an embodiment of the present disclosure.
Figure 2I:
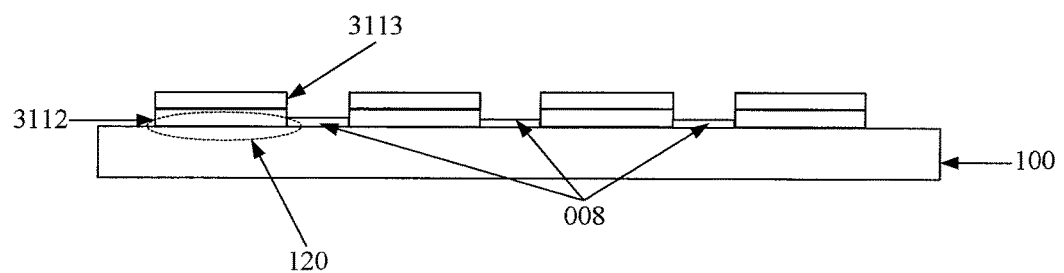
FIG. 2I is a structural schematic view of a first electrode and a photosensitive material layer formed sequentially on a light-exiting surface of an array substrate provided by an embodiment of the present disclosure.

FIG. 2I shows a structural schematic view of a plurality of photosensitive modules formed within the light non-transmission region of the light-exiting surface of the array substrate. In FIG. 2I, reference sign 120 indicates the light non-transmission region, and reference sign 0008 indicates a pixel corresponding to an area which is a light transmission region of the array substrate.

In step 2015, scanning lines each corresponding to and electrically connected to one row of the photosensitive modules, and read lines each corresponding to and electrically connected to one column of the photosensitive modules are formed on the light-exiting surface of the array substrate provided with the plurality of photosensitive modules.

As shown in FIG. 1B, scanning lines 320 each corresponding to and electrically connected to one row of the photosensitive modules 310, and read lines 330 each corresponding to and electrically connected to one column of the photosensitive modules 310 are formed on the surface of the packaging substrate (not shown in FIG. 1B) provided with the plurality of photosensitive modules 310.

In step 2016, n touch sensitive electrodes are formed on the light-exiting surface of the array substrate formed with the scanning lines and the read lines, such that one photosensitive module group is superposed on and electrically connected with one touch sensitive electrode.

As shown in FIG. 2H, n touch sensitive electrodes 410 are formed on the light-exiting surface of the array substrate 100 formed with the scanning lines (not shown in FIG. 2H) and the read lines (not shown in FIG. 2H). Reference sign 310 indicates the photosensitive module.

In an embodiment, the process for manufacturing each photosensitive module may include: forming the photosensitive sub-module on the light-exiting surface of the array substrate; and forming the switch sub-module on the light-exiting surface of the array substrate formed with the photosensitive sub-module.

In an embodiment, as shown in FIG. 1D, the photosensitive sub-module 311 includes a first electrode 3112 and a photosensitive material layer 3113. As shown in FIG. 1B, the switch sub-module 312 is a thin film transistor, which has a gate electrically connected to the scanning line.

Correspondingly, forming the photosensitive sub-module on the light-exiting surface of the array substrate may include: forming a photosensitive material layer and a first electrode sequentially on the light-exiting surface of the array substrate.

In an embodiment, the photosensitive material layer contacts both the touch sensitive electrode and the first electrode; one of a source electrode and a drain electrode of the thin film transistor is connected to the read line, and the other of the source electrode and the drain electrode of the thin film transistor is connected to the first electrode of the photosensitive sub-module. As shown in FIG. 2I, a photosensitive material layer 3113 and a first electrode 3112 are formed sequentially on the light-exiting surface of the array substrate 100.

In an embodiment, the packaging jointing surface is a surface of the packaging substrate or the light-exiting surface of the array substrate, the method further comprises, after step 201: forming a flexible circuit board, which is electrically connected to the scanning lines and the read lines respectively, on the packaging jointing surface formed with the photosensitive device and the touch sensitive device. For example, as shown in FIG. 1D, a flexible circuit board is formed on a surface of the packaging substrate 200 formed with the photosensitive device and the touch sensitive device. In an embodiment, the flexible circuit board 340 is positioned between the packaging substrate 200 and the sealing agent 001. The scanning lines and the read lines in the display panel may be electrically connected to an external circuit through the flexible circuit board.

In addition, the method further comprises: connecting the scanning lines and the read lines electrically with an external circuit by the integrated circuit. Correspondingly, after step 201, the method may comprises: forming an integrated circuit, which is electrically connected to the scanning lines and the read lines respectively, on the packaging jointing surface formed with the photosensitive device and the touch sensitive device.

The display panel and the method of manufacturing the same are applicable to any OLED display apparatus. The advantages caused by adopting the manufacturing method are in that the original packaging structure need not be changed, the thickness of the display panel is smaller, no additional light blocking component need be added, and the structure of the display panel is simpler. When the photosensitive device and the touch sensitive device are formed on a surface of the packaging substrate, the number of the signal lines on the array substrate is smaller, and the structure of the array substrate is simpler. In addition, the loss of the light signal caused by the display panel is less, so the accuracy of the fingerprint identification is higher. Furthermore, the display period and the touch control period need not be driven in a time-sharing manner.

It should be appreciated for the skilled person in the art that the above described method embodiments may refer to the above mentioned corresponding device embodiments, for purpose of clear and concise.

As above described, the method of manufacturing a display panel provided by embodiments of the present disclosure comprises forming the photosensitive device and the touch sensitive device on a surface of the packaging substrate or on light exiting surface of the array substrate such that the touch sensitive device is positioned between the photosensitive device and the packaging substrate, and the photosensitive device and the touch sensitive device are used for achieving the touch control function and the fingerprint identifying function. Compared with the prior arts, the display panel can achieve the fingerprint identification function and the touch control function at the same time, enriching the functions of the display panel.

An embodiment of the present disclosure also provides a display apparatus comprising the display panel according to any one of the above embodiments. The display apparatus may be a mobile phone, a tablet computer, a TV, a display, a notebook computer, a digital photo frame, a navigator and any product or component having a displaying function.

From the above, the display apparatus provided by embodiments of the present disclosure comprises the display panel having the photosensitive device and the touch sensitive device formed between the packaging substrate and the array substrate, the touch sensitive device is positioned between the photosensitive device and the packaging substrate, and the photosensitive device and the touch sensitive device are used for achieving the touch control function and the fingerprint identifying function. Compared with the prior arts, the display apparatus can achieve the fingerprint identification function and the touch control function at the same time, enriching the functions of the display apparatus.

The above only refers to exemplary embodiments of the disclosure and is not intended to limit the present disclosure. Various modifications, changes and alternatives made without departing from spirit and principle of the present disclosure fall within the scope of the present disclosure.

What is claimed is:

1. A display panel, comprising: an array substrate, a packaging substrate disposed above the array substrate, a photosensitive device, and a touch sensitive device;
   wherein the photosensitive device and the touch sensitive device are formed between the packaging substrate and the array substrate, and the touch sensitive device is positioned between the photosensitive device and the packaging substrate;
   wherein a display area of the array substrate includes a light transmission region and a light non-transmission region,
   the photosensitive device includes a plurality of photosensitive modules arranged in an array, scanning lines each corresponding to and electrically connected to one row of the photosensitive modules, and read lines each corresponding to and electrically connected to one column of the photosensitive modules, the plurality of photosensitive modules being divided into n photosensitive module groups, where n is equal to or greater than one, an orthographic projection of each photosensitive module on the array substrate is located within the light non-transmission region of the array substrate,
   the touch sensitive device includes n touch sensitive electrodes, each of which is superposed on and electrically connected to one of the photosensitive module groups, and
   each of the photosensitive modules is configured to output a current signal through a corresponding one of the read lines under a scanning signal output by a corresponding one of the scanning lines.

2. A display panel according to claim 1, wherein the touch sensitive device is configured to determine information about a position where a user's finger touches the display panel, and
   the photosensitive device is configured to receive a light signal reflected by a fingerprint pattern of the user's finger, and to generate the current signal for identifying the fingerprint pattern on the basis of the light signal.

3. A display panel according to claim 1, wherein each of the photosensitive modules includes a photosensitive sub-module electrically connected to a corresponding one of touch sensitive electrodes, and a switch sub-module electrically connected to the scanning line, the read line and the photosensitive sub-module respectively.

4. A display panel according to claim 3, wherein the photosensitive sub-module includes a first electrode and a photosensitive material layer formed between the touch sensitive electrode and the first electrode, the photosensitive material layer being in contact with the touch sensitive electrode and the first electrode; and
   wherein the switch sub-module is a thin film transistor, a gate of the thin film transistor being connected to the scanning line, one of a source electrode and a drain electrode of the thin film transistor being electrically connected to the read line, the other one of the source electrode and the drain electrode of the thin film transistor being electrically connected to the first electrode of the photosensitive sub-module.

5. A display panel according to claim 2, wherein the photosensitive device is further configured to determine information about a position where the user's finger touches the display panel.

6. A display panel according to claim 1, wherein the display panel further includes a flexible circuit board respectively electrically connected to the scanning lines and the read lines.

7. A display panel according to claim 1, wherein the display panel further includes an integrated circuit respectively electrically connected to the scanning lines and the read lines.

8. A display panel according to claim 1, wherein the touch sensitive electrode is made of a transparent conductive material.

9. A display panel according to claim 3, wherein the first electrode is a reflecting electrode configured to reflect light reflected by the fingerprint pattern, and the display panel further includes a circular polarizer provided on a side of the packaging substrate facing away from the photosensitive device and the touch sensitive device.

10. A display apparatus, comprising the display panel of claim 1.

11. A method of manufacturing a display panel comprising an array substrate and a packaging substrate, the method comprising:
    forming a photosensitive device and a touch sensitive device on a preset packaging surface, which is a surface of the packaging substrate or an light-exiting surface of the array substrate, such that the touch sensitive device is positioned between the photosensitive device and the packaging substrate; and
    arranging the packaging substrate above the array substrate so that the photosensitive device and the touch sensitive device are both positioned between the packaging substrate and the array substrate;
    wherein a display area of the array substrate includes a light transmission region and a light non-transmission region, the photosensitive device includes a plurality of photosensitive modules arranged in an array, scanning lines each corresponding to and electrically connected to one row of the photosensitive modules, and read lines each corresponding to and electrically connected to one column of the photosensitive modules, the plurality of photosensitive modules are divided into n photosensitive module groups, where n is equal to or greater than 1, the touch sensitive device includes n touch sensitive electrodes.

12. The method according to claim 11, wherein the step of forming a photosensitive device and a touch sensitive device on the preset packaging surface includes:
    forming the n touch sensitive electrodes on the surface of the packaging substrate;
    forming the plurality of photosensitive modules in a target area of the surface of the packaging substrate formed with the n touch sensitive electrodes, such that each of the photosensitive modules is superposed on and electrically connected to one of the touch sensitive electrodes, the target area being an orthographic projection area of the light non-transmission region of the array substrate on the packaging substrate; and
    forming scanning lines each corresponding to and electrically connected to one row of the photosensitive modules, and read lines each corresponding to and electrically connected to one column of the photosensitive modules, on the surface of the packaging substrate formed with the plurality of photosensitive modules.

13. The method according to claim 11, wherein the step of forming a photosensitive device and a touch sensitive device on the preset packaging surface includes:
  forming the plurality of photosensitive modules within the light non-transmission region of the light-exiting surface of the array substrate;
  forming scanning lines each corresponding to and electrically connected to one row of the photosensitive modules, and read lines each corresponding to and electrically connected to one column of the photosensitive modules, on the light-exiting surface of the packaging substrate formed with the plurality of photosensitive modules; and
  forming the n touch sensitive electrodes on the light-exiting surface of the packaging substrate formed with the scanning lines and the read lines, such that each of the photosensitive module is superposed on and electrically connected to one of the touch sensitive electrodes.

14. The method according to claim 12, wherein each of the photosensitive modules includes a photosensitive sub-module and a switch sub-module, and forming the photosensitive module, includes:
  forming the photosensitive sub-module on the preset packaging surface; and
  forming the switch sub-module on the preset packaging surface formed with the photosensitive module.

15. The method according to claim 14, wherein the photosensitive sub-module includes a first electrode and a photosensitive material layer, the switch sub-module is a thin film transistor having a gate electrically connected to the scanning line, and the preset packaging surface is a surface of the packaging substrate,
  wherein forming a photosensitive sub-module on the preset packaging surface includes:
    forming the photosensitive material layer and the first electrode sequentially on the surface of the packaging substrate formed with the touch sensitive electrode; and
  wherein the touch sensitive electrode and the first electrode both contact the photosensitive material layer, one of a source electrode and a drain electrode of the thin film transistor is electrically connected to the read line, and the other of the source electrode and the drain electrode of the thin film transistor is electrically connected to the first electrode of the photosensitive sub-module.

16. The method according to claim 14, wherein the photosensitive sub-module includes a first electrode and a photosensitive material layer, and the switch sub-module is a thin film transistor having a gate connected to the scanning line, and the preset packaging surface is the light-exiting surface of the packaging substrate,
  wherein forming the photosensitive sub-module on the preset packaging surface includes:
    forming the photosensitive material layer and the first electrode sequentially on the light-exiting surface of the packaging substrate; and
  wherein the touch sensitive electrode and the first electrode both contact the photosensitive material layer, one of a source electrode and a drain electrode of the thin film transistor is connected to the read line, and the other of the source electrode and the drain electrode of the thin film transistor is connected to the first electrode of the photosensitive sub-module.

17. The method according to claim 12, wherein after forming the photosensitive device and the touch sensitive device on the preset packaging surface, the method further comprises:
  forming a flexible circuit board, which is respectively electrically connected with the scanning lines and the read lines, on the preset packaging surface formed with the photosensitive device and the touch sensitive device.

18. The method according to claim 12, wherein after forming a photosensitive device and a touch sensitive device on the preset packaging surface, the method further comprises:
  forming an integrated circuit, which is respectively electrically connected to the scanning lines and the read lines, on the preset packaging surface formed with the photosensitive device and the touch sensitive device.

19. The method according to claim 15, wherein forming the first electrode includes forming a reflecting electrode by a reflective material, and
  the method further comprises providing a circular polarizer on a side of the packaging substrate facing away from the photosensitive device and the touch sensitive device.

* * * * *